US009018050B2

(12) United States Patent
Li et al.

(10) Patent No.: US 9,018,050 B2
(45) Date of Patent: Apr. 28, 2015

(54) ROLLED-UP TRANSMISSION LINE STRUCTURE FOR A RADIOFREQUENCY INTEGRATED CIRCUIT (RFIC)

(71) Applicant: The Board of Trustees of the University of Illinois, Urbana, IL (US)

(72) Inventors: Xiuling Li, Champaign, IL (US); Wen Huang, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/051,192

(22) Filed: Oct. 10, 2013

(65) Prior Publication Data
US 2014/0246764 A1 Sep. 4, 2014

Related U.S. Application Data

(60) Provisional application No. 61/888,833, filed on Oct. 9, 2013, provisional application No. 61/818,689, filed on May 2, 2013, provisional application No. 61/712,360, filed on Oct. 11, 2012.

(51) Int. Cl.
*H01L 21/335* (2006.01)
*H01L 21/8232* (2006.01)
(Continued)

(52) U.S. Cl.
CPC *H01L 23/66* (2013.01); *H01F 5/02* (2013.01); *H01F 41/02* (2013.01); *H01L 28/10* (2013.01); *H01F 27/2847* (2013.01); *H01F 41/0604* (2013.01); *H01L 23/645* (2013.01);
(Continued)

(58) Field of Classification Search
USPC ......... 438/142, 513, 135, 678, 602, 603, 604, 438/606, 680, 686, 687, 688, 662, 723, 724, 438/756, 757, 769; 257/277, E21.006, 257/E21.077, E21.085, E21.126, E21.127, 257/E21.17, E21.212, E21.218, E21.227, 257/E21.267, E21.278, E21.293, E21.311, 257/E21.329, E21.475, E21.59, E21.603
See application file for complete search history.

(56) References Cited

U.S. PATENT DOCUMENTS 6,183,267 B1 * 2/2001 Marcus et al. .................. 439/66
6,290,510 B1 * 9/2001 Fork et al. ...................... 439/81
(Continued)

FOREIGN PATENT DOCUMENTS

EP 2 423 162 A1 2/2012

OTHER PUBLICATIONS

Ali, M.S. Mohamed et al., "Out-of-plane spiral-coil inductor self-assembled by locally controlled bimorph actuation," *Micro & Nano Letters*, 6, 12 (2011) pp. 1016-1018.
(Continued)

*Primary Examiner* — David Nhu
(74) *Attorney, Agent, or Firm* — Brinks Gilson & Lione

(57) ABSTRACT

A rolled-up transmission line structure for a radiofrequency integrated circuit (RFIC) comprises a multilayer sheet in a rolled configuration comprising multiple turns about a longitudinal axis, where the multilayer sheet comprises a conductive pattern layer on a strain-relieved layer. The conductive pattern layer comprises a first conductive film and a second conductive film separated from the first conductive film in a rolling direction. In the rolled configuration, the first conductive film surrounds the longitudinal axis, and the second conductive film surrounds the first conductive film. The first conductive film serves as a signal line and the second conductive film serves as a conductive shield for the rolled-up transmission line structure.

20 Claims, 10 Drawing Sheets

(51) Int. Cl.

| | |
|---|---|
| *H01L 23/66* | (2006.01) |
| *H01F 5/02* | (2006.01) |
| *H01F 41/02* | (2006.01) |
| *H01L 49/02* | (2006.01) |
| *H01F 27/28* | (2006.01) |
| *H01F 41/06* | (2006.01) |
| *H01L 23/64* | (2006.01) |
| *H01L 21/48* | (2006.01) |
| *H01F 17/00* | (2006.01) |
| *H01F 41/04* | (2006.01) |

(52) U.S. Cl.
CPC ..... *H01L2924/0002* (2013.01); *H01L 21/4814* (2013.01); *H01L 2223/6627* (2013.01); *H01F 17/0013* (2013.01); *H01F 41/041* (2013.01); *H01F 2017/006* (2013.01); *H01F 2027/2857* (2013.01)

(56) References Cited

U.S. PATENT DOCUMENTS

| | | | | |
|---|---|---|---|---|
| 7,000,315 | B2 * | 2/2006 | Chua et al. | 29/874 |
| 7,517,769 | B2 * | 4/2009 | Van Schuylenbergh et al. | 438/381 |
| 7,707,714 | B2 * | 5/2010 | Schmidt et al. | 29/842 |
| 7,733,205 | B2 * | 6/2010 | Hyvonen | 336/84 C |
| 8,679,888 | B2 * | 3/2014 | Rogers et al. | 438/57 |

OTHER PUBLICATIONS

Arora, William J. et al., "Membrane folding to achieve three-dimensional nanostructures: Nanopatterned silicon nitride folded with stressed chromium hinges," *Applied Physics Letters*, 88, 053108 (2006) pp. 053108-1-053108-3.
Bianucci, P. et al., "Self-Organized 1.55 μm InAs/InP Quantum Dot Tube Nanoscale Coherent Light Sources," *Winter Topicals (WTM) IEEE, Conference Publication* (2011), pp. 127-128.
Bof Bufon, Carlos César et al., "Self-Assembled Ultra-Compact Energy Storage Elements Based on Hybrid Nanomembranes," *Nano Letters*, 10 (2010) pp. 2506-2510.
Bogush, V. et al., "Electroless deposition of novel Ag-W thin films," *Microelectronic Engineering*, 70 (2003) pp. 489-494.
Chen, Daru et al., "A novel low-loss Terahertz waveguide: Polymer tube," *Optics Express*, 18, 4 (2010) pp. 3762-3767.
Chun, Ik Su et al., "Controlled Assembly and Dispersion of Strain-Induced InGaAs/GaAs Nanotubes," *IEEE Transactions on Nanotechnology*, 7, 4 (2008) pp. 493-495.
Chun, I.S. et al., "InGaAs/GaAs 3D architecture formation by strain-induced self-rolling with lithographically defined rectangular stripe arrays," *Journal of Crystal Growth*, 310 (2008) pp. 2353-2358.
Chun, Ik Su et al., "Geometry Effect on the Strain-Induced Self-Rolling of Semiconductor Membranes," *Nano Letters*, 10 (2010) pp. 3927-3932.
Dai, Lu et al., "Directional scrolling of SiGe/Si/Cr nanoribbon on Si(111) surfaces controlled by two-fold rotational symmetry underetching," *Nanoscale*, 5 (2013) pp. 971-976.
Dai, L. et al., "Strain-driven self-rolling mechanism for anomalous coiling of multilayer nanohelices," *Journal of Applied Physics*, 106, 114314 (2009) pp. 114314-1-114314-5.
Doerner, M. et al., "Stresses and Deformation Processes in Thin Films on Substrates," *CRC Critical Reviews in a Solid State and Materials Sciences*, 14, 3 (1988) pp. 224-268.
Du, Frank et al., "Aligned arrays of single walled carbon nanotubes for transparent electronics," *Proceedings of SPIE*, 8725 (2013) pp. 87251S-1-87251S-7.
Frankel, Michael Y., "Terahertz Attenuation and Dispersion Characteristics of Coplanar Transmission Lines," *IEEE Transactions on Microwave Theory and Techniques*, 39, 6 (1991), pp. 910-916.

Golod, S. V. et al., "Fabrication of conducting GeSi/Si micro- and nanotubes and helical microcoils," *Semiconductor Science and Technology*, 16 (2001) pp. 181-185.
Golod, S.V. et al., "Freestanding SiGe/Si/Cr and SiGe/Si/Si$_x$N$_y$/Cr Microtubes," *Applied Physics Letters*, 84, 17 (2004) pp. 3390-3393.
Gorin, A. et al., "Fabrication of silicon nitride waveguides for visible-light using PECVD: a study of the effect of plasma frequency on optical properties," *Optics Express*, 16, 18 (2008) pp. 13509-13516.
Harazim, Stefan M. et al., "Fabrication and applications of large arrays of multifunctional rolled-up SiO/SiO$_2$ microtubes," *Journal of Materials Chemistry*, 22, 7 (2012) pp. 2878-2884.
Heiliger, H.-M. et al., "Low-dispersion thin-film microstrip lines with cyclotene (benzocyclobutene) as dielectric medium," *Applied Physics Letters*, 70, 17 (1997) pp. 2233-2235.
Huang, G. S. et al., "Optical properties of rolled-up tubular microcavities from shaped nanomembranes," *Applied Physics Letters*, 94, 141901 (2009) 141901-1-141901-3.
Huang, Minghuang et al., "Nanomechanical Architecture of Strained Bilayer Thin Films: From Design Principles to Experimental Fabrication," *Advanced Materials*, 17 (2005) pp. 2860-2864.
Huang, Gaoshan et al., "Thinning and Shaping Solid Films into Functional and Integrative Nanomembranes," *Advanced Materials*, 24 (2012) pp. 2517-2546.
Huang, Gaoshan et al., "Rolled-up transparent microtubes as two-dimensionally confined culture scaffolds of individual yeast cells," *Lab Chip*, 9 (2009) pp. 263-268.
Huang, Minghuang et al., "Mechano-electronic Superlattices in Silicon Nanoribbons," *ACS Nano*, 3, 3 (2009) pp. 721-727.
Inberg, A. et al., "Novel Highly Conductive Silver-Tungsten Thin Films Electroless Deposited from Benzoate Solution for Microelectronic Applications," *Journal of The Electrochemical Society*, 150, 5 (2003) pp. C285-C291.
Ishigaki, Tsukasa et al., "Photonic-Crystal Slab for Terahertz-Wave Integrated Circuits," *Photonics Conference (IPC) IEEE, Conference Publication* (2012) pp. 774-775.
Jan, C.-H. et al., "A 32nm SoC Platform Technology with 2$^{nd}$ Generation High-k/Metal Gate Transistors Optimized for Ultra Low Power, High Performance, and High Density Product Applications," *IEEE*, (2009) pp. 647-650.
Jiang, Hongrui et al., "On-Chip Spiral Inductors Suspended over Deep Copper-Lined Cavities," *IEEE Transactions on Microwave Theory and Techniques*, 48, 12 (2000) pp. 2415-2423.
Li, Feng et al., "Coherent emission from ultrathin-walled spiral InGaAs/GaAs quantum dot microtubes," *Optics Letters*, 34, 19 (2009) pp. 2915-2917.
Li, Weizhi et al., "Influences of Process Parameters of Low Frequency PECVD Technology on Intrinsic Stress of Silicon Nitride Thin Film," *Proc. Of SPIE*, 7658 (2010) pp. 765824-1-765824-7.
Li, Xiuling, "Self-rolled-up microtube ring resonators: a review of geometrical and resonant properties," *Advances in Optics and Photonics*, 3 (2011) pp. 366-387.
Li, Xiuling, "Strain induced semiconductor nanotubes: from formation process to device applications," *Journal of Physics D: Applied Physics*, 41 (2008) 193001, pp. 1-12.
Logeeswaran, V. J. et al., "Ultrasmooth Silver Thin Films Deposited with a Germanium Nucleation Layer," *Nano Letters*, 9, 1 (2009) pp. 178-182.
Luchnikov, V. et al., "Toroidal hollow-core microcavities produced by self-rolling of strained polymer bilayer films," *Journal of Micromechanics and Microengineering*, 18 (2008) 035041, pp. 1-5.
Luo, J. K. et al., "Modelling and fabrication of low operation temperature microcages with a polymer/metal/DLC trilayer structure," *Sensors and Actuators A*, 132 (2006) pp. 346-353.
Masi, Maurizio et al., "Modeling of Silicon Nitride Deposition by RF Plasma-Enhanced Chemical Vapor Deposition," *Chemical Engineering Science*, 49, 5 (1994) pp. 669-679.
Mei, Yongfeng et al., "Versatile Approach for Integrative and Functionalized Tubes by Strain Engineering of Nanomembranes on Polymers," *Advanced Materials*, 20 (2008) pp. 4085-4090.
Mi, Zetian et al., "1.3-1.55 μm Self-Organized InAs Quantum Dot Tube Nanoscale Lasers on Silicon," *Photonics Conference (PHO), IEEE, Conference Publication* (2011) pp. 535-536.

(56) References Cited

OTHER PUBLICATIONS

Mitrofanov, Oleg et al., "Reducing Transmission Losses in Hollow THz Waveguides," *IEEE Transactions on Terahertz Science and Technology*, 1, 1 (2011) pp. 124-132.
Mitrofanov, Oleg et al., "Dielectric-lined cylindrical metallic THz waveguides: mode structure and dispersion," *Optics Express*, 18, 3 (2010) pp. 1898-1903.
Moiseeva, E. et al., "Single-mask microfabrication of three-dimensional objects from strained bimorphs," *Journal of Micromechanics and Microengineering*, 17 (2007) pp. N63-N68.
Müller, Christian et al., "Tuning giant magnetoresistance in rolled-up Co-Cu nanomembranes by strain engineering," *Nanoscale*, 4 (2012) pp. 7155-7160.
Nguyen, Nhat M. et al., "Si IC-Compatible Inductors and *LC* Passive Filters," *IEEE Journal of Solid-State Circuits*, 25, 4 (1990) pp. 1028-1031.
Pahlevaninezhad, H. et al., "Advances in Terahertz Waveguides and Sources," *IEEE Photonics Journal*, 3, 2 (2011) pp. 307-310.
Pang, Liang et al., "Transfer printing of flexible hybrid inductor-capacitor filters via pre-etched silicon-on-insulator mother wafer," *Applied Physics Letters*, 101, 063113 (2012) pp. 063113-1-063113-4.
Park, Min et al., "The Detailed Analysis of High $Q$ CMOS-Compatible Microwave Spiral Inductors in Silicon Technology," *IEEE Transactions on Electron Devices*, 45, 9 (1998) pp. 1953-1959.
Parvizian, M. et al., "Residual stress improvement of platinum thin film in Au/Pt/Ti/p-GaAs ohmic contact by RF sputtering power," *Applied Surface Science*, 260 (2012) pp. 77-79.
Prinz, V. Ya. et al., "Free-standing and overgrown InGaAs/GaAs nanotubes, nanohelices and their arrays," *Physica E*, 6 (2000) pp. 828-831.
Rottler, Andreas et al., "Rolled-up nanotechnology for the fabrication of three-dimensional fishnet-type GaAs-metal metamaterials with negative refractive index at near-infrared frequencies," *Applied Physics Letters*, 100, 151104 (2012) pp. 151104-1-151104-4.
Schulze, Sabine et al., "Morphological Differentiation of Neurons on Microtopographic Substrates Fabricated by Rolled-Up Nanotechnology," *Advanced Engineering Materials*, 12, 9 (2010), pp. B558-B564.
Seidel, H. et al., "Anisotropic Etching of Crystalline Silicon in Alkaline Solutions," *J. Electrochem. Soc.*, 137, 11 (1990) pp. 3612-3632.
Seleznev, V. A. et al., "Generation and Registration of Disturbances in a Gas Flow. 1. Formation of Arrays of Tubular Microheaters and Microsensors," *Journal of Applied Mechanics and Technical Physics*, 50, 2 (2009) pp. 291-296.
Shacham-Diamand, Yosi et al., "Electroless Silver and Silver with Tungsten Thin Films for Microelectronics and Microelectromechanical System Applications," *Journal of the Electrochemical Society*, 147, 9 (2000) pp. 3345-3349.
Shiplyuk, A. N. et al., "Generation and Registration of Disturbances in a Gas Flow. 2. Experiments with Arrays of Tubular Microheaters and Microsensors," *Journal of Applied Mechanics and Technical Physics*, 50, 3 (2009) pp. 454-458.
Smith, Donald L. et al., "Mechanism of $SiN_xH_y$ Deposition from $NH_3$-$SiH_4$ Plasma," *J. Electrochem. Soc.*, 137, 2 (1990) pp. 614-623.
Smith, Elliot J. et al., "Lab-in-a-Tube: Detection of Individual Mouse Cells for Analysis in Flexible Split-Wall Microtube Resonator Sensors," *Nano Letters*, 11 (2011) pp. 4037-4042.
Songmuang, R. et al., "From rolled-up Si microtubes to $SiO_x$/Si optical ring resonators," *Microelectronic Engineering*, 84 (2007) pp. 1427-1430.
Tang, Chih-Chun et al., "Miniature 3-D Inductors in Standard CMOS Process," *IEEE Journal of Solid-State Circuits*, 37, 4 (2002) pp. 471-480.
Tian, Dongbin et al., "Dual cylindrical metallic grating-cladding polymer hollow waveguide for terahertz transmission with low loss," *Applied Physics Letters*, 97, (2010) pp. 133502-1-133502-3.
Tian, Zhaobing et al., "Controlled Transfer of Single Rolled-Up InGaAs-GaAs Quantum-Dot Microtube Ring Resonators Using Optical Fiber Abrupt Tapers," *IEEE Photonics Technology Letters*, 22, 5 (2010) pp. 311-313.
Tian, Zhaobing et al., "Single rolled-up InGaAs/GaAs quantum dot microtubes integrated with silicon-on-insulator waveguides," *Optics Express*, 19, 13 (2011) pp. 12164-12171.
Timoshenko, S., "Analysis of Bi-Metal Thermostats," *Journal of the Optical Society of America*, 11 (1925) pp. 233-255.
Walmsley, Byron A. et al., "Poisson's Ratio of Low-Temperature PECVD Silicon Nitride Thin Films," *Journal of Microelectromechanical Systems*, 16, 3 (2007) pp. 622-627.
Wang, To-Po et al., "High-Q Micromachined Inductors for 10-to-30-GHz RFIC Applications on Low Resistivity Si-Substrate," *Proceedings of the 36th European Microwave Conference*, (2006) pp. 56-59.
Wheeler, Harold A., "Formulas for the Skin Effect," *Proceedings of the I.R.E.*, (1942) pp. 412-424.
Wiemer, L. et al., "Determination of Coupling Capacitance of Underpasses, Air Bridges and Crossings in MICs and MMICs," *Electronics Letters*, 23, 7 (1987) pp. 344-346.
Xu, Xiangdong et al., "Chemical Control of Physical Properties in Silicon Nitride Films," *Appl. Phys. A.*, 111 (2013) pp. 867-876.
Yue, C. Patrick et al., "A Physical Model for Planar Spiral Inductors on Silicon," *IEEE, IEDM*, 96 (1996) pp. 155-158.
Yue, C. Patrick et al., "Physical Modeling of Spiral Inductors on Silicon," *IEEE Transactions on Electron Devices*, 47, 3 (2000) pp. 560-568.
Yu, Minrui et al., "Semiconductor Nanomembrane Tubes: Three-Dimensional Confinement for Controlled Neurite Outgrowth," *ACS Nano*, 5, 4 (2011) pp. 2447-2457.
Zang, Ji et al., "Mechanism for Nanotube Formation from Self-Bending Nanofilms Driven by Atomic-Scale Surface-Stress Imbalance," *Physical Review Letters*, 98, (2007) pp. 146102-1-146102-4.
Zolfaghari, Alireza et al., "Stacked Inductors and Transformers in CMOS Technology," *IEEE Journal of Solid-State Circuits*, 36, 4 (2001) pp. 620-628.

\* cited by examiner

ROLLED-UP TRANSMISSION LINE STRUCTURE FOR A RADIOFREQUENCY INTEGRATED CIRCUIT (RFIC)

RELATED APPLICATIONS

The present patent document claims the benefit of priority under 35 U.S.C. 119(e) to U.S. Provisional Patent Application Ser. No. 61/888,833, filed on Oct. 9, 2013, to U.S. Provisional Patent Application Ser. No. 61/818,689, filed on May 2, 2013, and to U.S. Provisional Patent Application Ser. No. 61/712,360, filed on Oct. 11, 2012, all of which are hereby incorporated by reference in their entirety.

Also incorporated by reference in their entirety are the U.S. nonprovisional patent applications entitled "Rolled-up Inductor Structure for a Radiofrequency Integrated Circuit (RFIC)," and "Rolled-up Transformer Structure for a Radiofrequency Integrated Circuit (RFIC)," which have the same filing date, Oct. 10, 2013, as the present patent document and which also claim priority to the above-mentioned provisional patent applications.

FEDERALLY SPONSORED RESEARCH OR DEVELOPMENT

This invention was made with government support under award numbers ECCS 0747178 and 1309375 from the National Science Foundation, DE-FG02-07ER46471 from the Department of Energy, and N000141110634 from the Office of Naval Research. The government has certain rights in the invention.

TECHNICAL FIELD

The present disclosure is directed generally to on-chip device structures and more particularly to transmission line structures for radiofrequency integrated circuits (RFICs).

BACKGROUND

On-chip transmission lines are used to connect independent active and passive components in monolithic integrated circuits (ICs). Transmission lines are designed to carry alternating current of radio frequency (RF) that is high enough so that their wave nature must be taken into account. According to the desired working frequency, on-chip transmission lines can be classified into several types that carry different electromagnetic wave modes. Among them, transverse electromagnetic wave mode (TEM) or quasi-TEM mode transmission lines are the most commonly used for on-chip applications as they have an ultra wide frequency band from DC to the cut-off frequency of their first high order mode. However, when the working frequency of integrated circuits goes into the terahertz band (0.1 THz-10 THz), existing transmission lines both on-chip and off-chip are unable to keep up with the speed. Current on-chip transmission lines have planar structures that may be conveniently fabricated and integrated using standard two-dimensional integrated circuit processing; however, these devices tend to have large ohmic, radiation and dielectric losses, particularly in the terahertz band.

BRIEF SUMMARY

A rolled-up on-chip transmission line structure has been developed to overcome the shortcomings of existing planar devices at terahertz frequencies.

The rolled-up transmission line structure comprises a multilayer sheet in a rolled configuration comprising multiple turns about a longitudinal axis, where the multilayer sheet comprises a conductive pattern layer on a strain-relieved layer. The conductive pattern layer comprises a first conductive film and a second conductive film separated from the first conductive film in a rolling direction. In the rolled configuration, the first conductive film surrounds the longitudinal axis, forming a center core, and the second conductive film surrounds the first conductive film. The first conductive film serves as a signal line and the second conductive film serves as a conductive shield for the rolled-up transmission line structure.

A method of making a rolled-up transmission line structure includes: forming a sacrificial layer on a substrate; forming a strained layer on the sacrificial layer, the strained layer comprising an upper portion under tensile stress and a lower portion under compressive stress, the strained layer being held on the substrate by the sacrificial layer; forming a conductive pattern layer comprising a first conductive film separated from a second conductive film on the strained layer; initiating removal of the sacrificial layer from the substrate, thereby releasing an end of the strained layer, and continuing the removal of the sacrificial layer, thereby allowing the strained layer to move away from the substrate and roll up to relieve strain in the strained layer. The conductive pattern layer adheres to the strained layer during the roll-up, and a rolled-up transmission line structure is formed. After the roll-up, the first conductive film of the conductive pattern layer surrounds the longitudinal axis and defines a center core, and the second conductive film surrounds the first conductive film. Accordingly, the first conductive film serves as a signal line for carrying a time varying current, and the second conductive film serves as a conductive shield.

BRIEF DESCRIPTION OF THE DRAWINGS

FIG. 5A shows one frame of the dynamic rolling when the center core is formed; FIG. 5B shows one frame of the dynamic rolling when the center core is lifted up into the desired position; and FIG. 5C shows one frame of the dynamic rolling when the conductive shield is formed.

DETAILED DESCRIPTION

Figure 1:
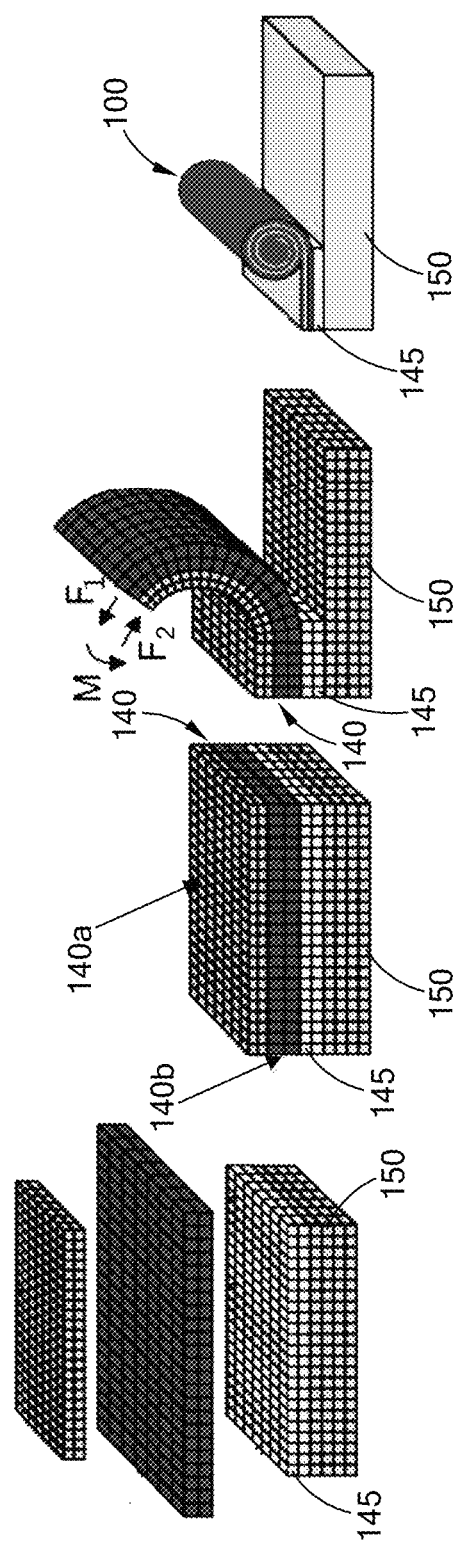
FIGS. 1A-1B show an exemplary strained bilayer comprising a top sublayer in tension and a bottom sublayer in compression deposited on a sacrificial layer on a substrate.
FIGS. 1C-1D show schematically the release and subsequent roll-up of the bilayer from the underlying sacrificial layer.

Described herein are three-dimensional (3D) transmission line structures formed in a self-rolling process that may exhibit very low energy losses at terahertz frequencies. Such transmission line structures have a carefully designed planar structure that is engineered to impart the desired dimensions and functionality upon roll-up.

FIGS. 1A-1D provide an introduction to the self-rolling concept. Rolled-up micro- and nanotubular device structures form spontaneously when strained planar sheets or membranes deform as a consequence of energy relaxation. A strained membrane may include a conductive pattern layer on an oppositely strained bilayer 140 (e.g., a top layer 140a in tension on a bottom layer 140b in compression), which is in contact with a sacrificial interlayer 145 on a substrate 150. The oppositely strained bilayer 140 may be released from the substrate 150 when the sacrificial layer 145 is etched away. Once released, the opposing strain within the bilayer 140 generates a net momentum, driving the planar membrane to scroll up and continue to roll into a tubular spiral structure 100. The conductive pattern layer itself can also provide additional residual stress (e.g., tensile stress) to facilitate rolling.

Figure 2:
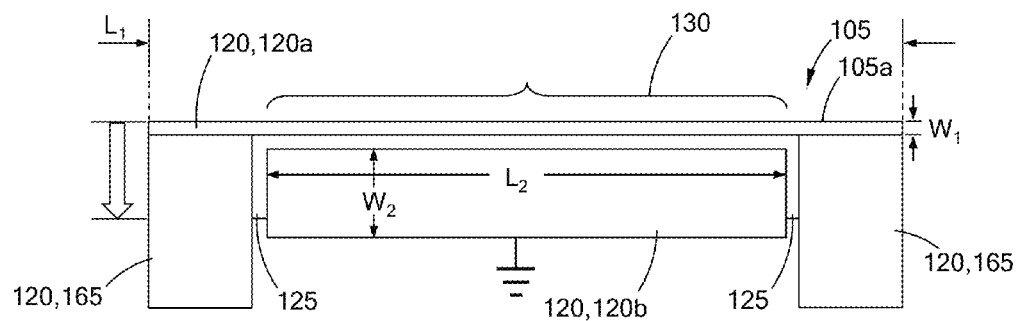
FIG. 2 shows the design of a planar conductive pattern layer on a strained layer prior to rolling up. The conductive pattern layer includes a first conductive film (which forms the center core/signal line upon roll-up), a second conductive film (which forms the conductive shield upon roll-up) and conductive feed lines connected to the first conductive film.
Figure 3:
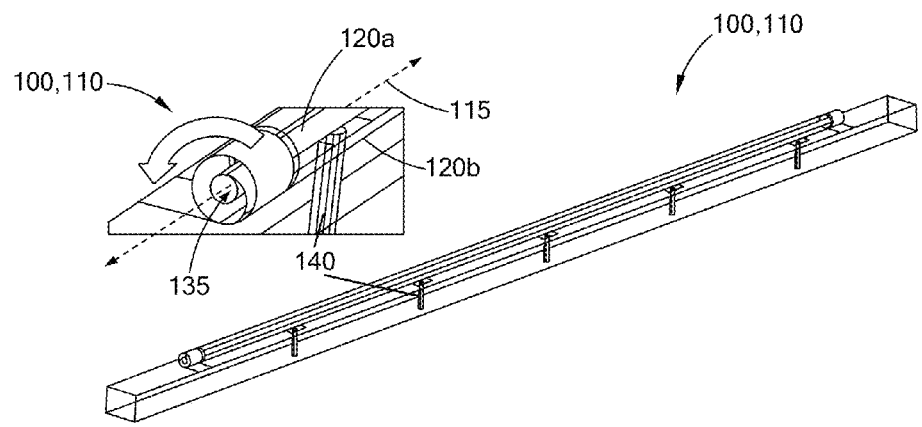
FIG. 3 shows a schematic (center) of a rolled-up transmission line device including the conductive pattern layer shown schematically in FIG. 2. The inset shows a close-up view of an end of the rolled-up transmission line. The vertical structures 140 are conductive via holes that connect the conductive shield to ground. In practical application, such via holes may not be needed if another means of connecting to ground is used.

FIG. 2 shows a planar multilayer sheet 105 comprising a conductive pattern layer 120 on a strained layer 125 prior to rolling up, and FIG. 3 shows a schematic of a coaxial rolled-up transmission line structure 100 that includes the conductive pattern layer 120 of FIG. 2 after full or partial relaxation of the residual stress in the strained layer 125. Accordingly, after rolling, the strained layer 125 may be referred to as the strain-relieved layer 125.

Referring to both FIGS. 2 and 3, the rolled-up transmission line structure 100 comprises a multilayer sheet 105 in a rolled configuration 110 including multiple turns about a longitudinal axis 115. The multilayer sheet 105 comprises a conductive pattern layer 120 on a strain-relieved layer 125, where the conductive pattern layer 120 comprises a first conductive film 120a separated from a second conductive film 120b in a rolling direction. The rolling direction, which may also be described as the circumferential direction, is shown by the arrow in FIG. 3. The term "separated," as used in the present disclosure, may refer to physical separation and/or to electrical isolation.

When the planar multilayer sheet 105 of FIG. 2 is rolled up, the first conductive film 120a surrounds the longitudinal axis 115, forming a center core 135 of the rolled configuration 110, and the second conductive film surrounds 120b the first conductive film 120a. The first conductive film 120a and the second conductive film 120b may be coaxial. The first conductive film 120a acts as a signal line for carrying a time varying current, and the second conductive film 120b acts as a conductive shield for confining the electromagnetic wave therewithin. The rolled-up structure 100 thus forms a transmission line.

Figure 4A:
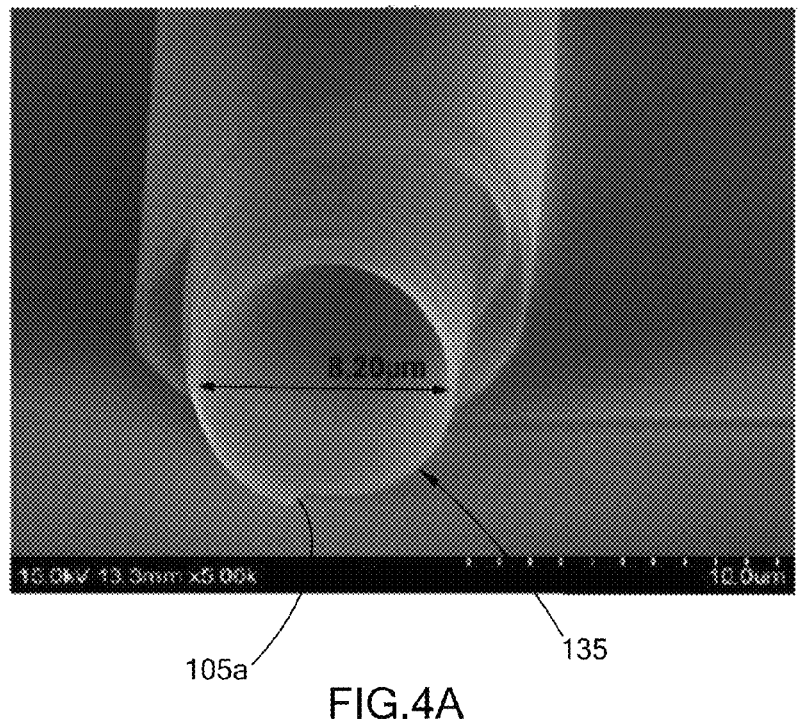
FIG. 4A shows a scanning electron microscope (SEM) image of a rolled up SiNx sheet (membrane) including multiple turns with an inner diameter of 8.2 microns.
Figure 4B:
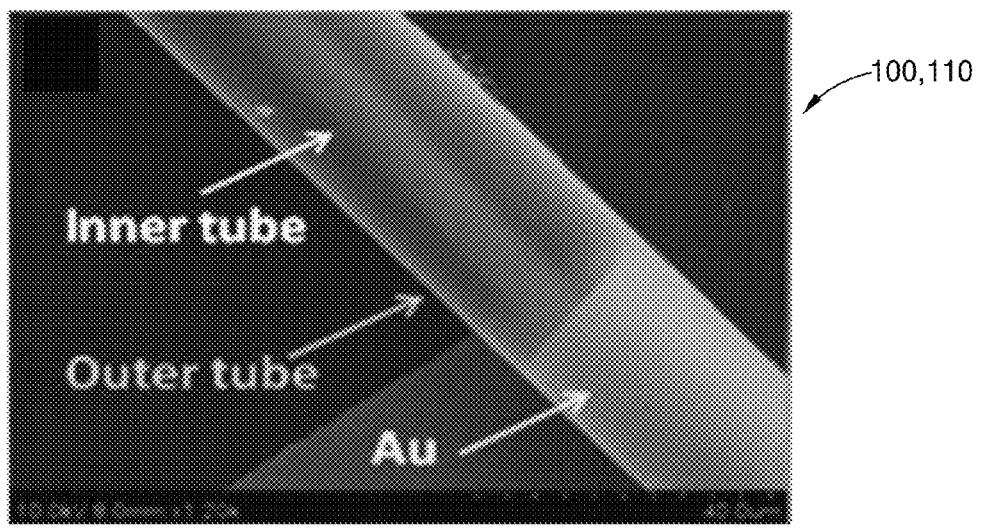
FIG. 4B shows a SEM image of a coaxial transmission line structure formed by rolling-up a SiNx sheet (membrane) including Au conductive feed lines.

The first conductive film 120a may be aligned with and extend along a first edge 105a of the multilayer sheet 105, as shown in FIG. 2. A first turn of the rolled configuration 110 may include the first edge 105a of the sheet 105 and define a hollow cylindrical core of the structure 100, creating the center core 135. The first conductive film 120a is shown in FIG. 2 as being positioned right at the first edge 105a of the multilayer sheet 105; however, there may be some spacing between the first conductive film 120a and the first edge 105a, such as at least about 5 microns, at least about 10 microns, and typically no more than about 20 microns. The scanning electron microscope (SEM) image of FIG. 4A shows an exemplary $SiN_x$ sheet (or membrane) 105 after self-rolling to an inner diameter of 8.2 microns, and FIG. 4B shows a SEM image of a coaxial transmission line structure formed by rolling up a $SiN_x$ sheet including a conductive pattern layer thereon.

The second conductive film 120b may surround only a central longitudinal portion 130 of the first conductive film 120a, due at least in part to the presence of conductive feed lines 165 that may be part of the conductive pattern layer 120. As shown in FIGS. 2 and 3, the conductive pattern layer 120 may comprise two conductive feed lines 165 connected to the first conductive film 120a at respective ends thereof. The conductive feed lines 165 are physically and/or electrically separated from the second conductive film 120b. Consequently, the central longitudinal portion 130 of the first conductive film 120a lies between the conductive feed lines 165 and may have a length that is determined by the widths of the feed lines 165. If no feed lines are present, the second conductive film 120b may surround not just the central longitudinal portion 130 of the first conductive film 120a but an entirety of the first conductive film 120a in the rolled configuration 110.

As shown, the two conductive feed lines 165 may extend away from the first conductive film 120a in a circumferential or rolling direction. Alternatively, the two conductive feed lines may extend away from the series of cells in another direction(s), such as in the same or opposing directions substantially parallel to (e.g., within ±1° of) the longitudinal axis 115 of the rolled structure 100. Such conductive feed lines 165 may be integrally formed with the first conductive film during fabrication (e.g., thin film deposition and patterning). In some embodiments, the conductive feed lines may not be needed, such as when the signal can be fed into the first conductive film directly from other passive or active components.

The first conductive film 120a may have an elongated rectangular shape when the multilayer sheet 105 is in an unrolled configuration, as shown in FIG. 2, and a rolled-up elongated rectangular shape when the multilayer sheet 105 is in the rolled configuration. The rolled-up elongated rectangular shape of the first conductive film 120 may have a length $L_1$ extending along the longitudinal axis 115 of the transmission line structure 100 and a width $W_1$ extending in the circumferential or rolling direction (and thus wrapping around the longitudinal axis 115). The length $L_1$ may be substantially parallel to (e.g., within ±1° of) the longitudinal axis 115, and the width $W_1$ may be substantially parallel to (e.g., within ±1° of) the rolling direction.

The second conductive film 120b may have a rectangular shape when the multilayer sheet 105 is in an unrolled configuration, and a rolled-up rectangular shape when the multilayer sheet 105 is in the rolled configuration. The rolled-up rectangular shape of the second conductive film 120b may have a length $L_2$ extending along the longitudinal axis 115 of the rolled-up transmission line structure 100 and a width $W_2$ extending in the circumferential or rolling direction (and thus wrapping around the longitudinal axis 115). The length $L_2$ may be substantially parallel to (e.g., within ±1° of) the longitudinal axis, and the width $W_2$ may be substantially parallel to (e.g., within ±1° of) the rolling direction.

To provide effective shielding, the width $W_2$ (the "second width") of the second conductive film 120b is typically larger than the width $W_1$ (the "first width") of the first conductive film 120a. For example, the second width may be at least about 2 times, at least about 3 times, at least about 4 times, or at least about 5 times as large as the first width. The second width may also be up to about 10 times, or up to about 20 times larger than the first width.

The strain-relieved layer 125 that underlies the conductive pattern layer 120 may comprise one or more sublayers that are at least partially relieved of lattice strain as a consequence of rolling. The multilayer sheet comprising the strain-relieved layer includes less lattice strain (or no lattice strain) in the rolled configuration than in an unrolled or planar configuration. Accordingly, the one or more sublayers that are referred to as a strain-relieved layer in the rolled configuration may be referred to as a strained layer in the unrolled configuration.

In the example of FIGS. 1A-1D, the strain-relieved layer (and the strained layer) may comprise two sublayers, which may be referred to as a bilayer. Specifically, the strained layer or bilayer 140 may comprise a top sublayer 140a in tension and a bottom sublayer 140b in compression to facilitate the rolling up shown schematically in FIGS. 1C-1D. The bilayer 140 may thus be referred to as an oppositely strained bilayer. The strain-relieved layer and the strained layer may comprise a single crystalline, polycrystalline or amorphous material.

The strain-relieved or strained layer (depending on whether or not rolling has taken place), may comprise an electrically insulating material such as silicon nitride, silicon oxide, or boron nitride. For example, the layer may comprise non-stoichiometric silicon nitride ($SiN_x$, where x may have a value from about 0.5 to about 1.5), which may be amorphous, or stoichiometric silicon nitride (e.g., $Si_3N_4$, $Si_2N$, $SiN$ or $Si_2N_3$). The layer may also or alternatively include another material, such as an elemental or compound semiconducting material or a polymer. For example, single crystal films such as InAs/GaAs, InGaAs/GaAs, InGaAsP/InGaAsP, Si—Ge/Si may be used as the strained layer.

Typically, the strained layer has a thickness of from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer includes two oppositely strained sublayers (a bilayer), it may be advantageous for the sublayers to have the same thickness.

The strain in the strained layer may be introduced by compositional or structural differences between sublayers that are successively deposited (e.g., by chemical vapor deposition) so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a, 140b may be reversed (compressive on top; tensile on bottom) in order to having the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD differ from single crystal films in that internal strain may not be developed by crystal lattice mismatch but rather by density differences and thermal mismatch achieved by appropriate deposition conditions.

It has been demonstrated experimentally that thin films deposited by different methods or under different conditions may provide a strained layer having adjustable values of residual stress in a wide range, such as from 478 to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a long enough distance to form as many turns as needed. To create a higher residual stress mismatch during deposition of the strained $SiN_x$ layers, for example, and thus a smaller tube diameter, the PECVD environment may be changed by adjusting a ratio of the $SiH_4$ flow rate to the $NH_3$ flow rate or by optimizing the power of the RF source. As long as the thin sheet or membrane is strained and can be released from the underlying substrate, rolled-up 3D architectures may form spontaneously with simple planar processing. The concept has been demonstrated for compound and elemental semiconductor material systems as well metal and dielectric materials, including silicon nitride.

The sacrificial layer may comprise a material that can be etched without removing or otherwise damaging the strained layer. For example, single crystalline and/or polycrystalline Ge, $GeO_x$, Si, and AlAs, as well as photoresist, may be used as a sacrificial layer. In one example, a strained bilayer comprising InAs/GaAs may be formed on a sacrificial layer comprising AlAs that may be etched away with hydrofluoric acid (HF).

The conductive pattern layer may comprise one or more high conductivity materials selected from the group consisting of carbon, silver, gold, aluminum, copper, molybdenum, tungsten, zinc, platinum, palladium, and nickel. As noted above, the conductive pattern layer may include additional tensile strain to facilitate rolling when the sacrificial layer is removed. Advantageously, the conductive pattern layer may be made as thick and smooth as possible to reduce the thin film or sheet resistivity without interfering with the rolling process. The sheet resistivity of the conductive pattern layer may have a significant impact on the performance and size of the rolled-up structure and is kept as low as possible. For example, the sheet resistivity may be about 5 μohm·cm or less.

The conductive pattern layer may have a multilayer structure, such as a Ni—Au—Ni trilayer structure. In such cases, the bottom layer may act as an adhesion layer, the middle layer may act as a conductive layer, and the top layer may act as a passivation/protection layer. Typically, adhesion and passivation layers have a thickness of from about 5-10 nm. As described above, the conductive pattern layer may include a first conductive film separated from a second metal film on the strain-relieved layer. In addition, each of the first and second conductive films may have a different thickness and/or a different high conductivity material.

It is also contemplated that the conductive pattern layer may comprise a two-dimensional material, such as graphene or transition metal dichalcogenides, e.g., $MoS_2$ $MoSe_2$, $WSe_2$ and/or $WS_2$. Such two-dimensional materials can be viewed as free-standing atomic planes comprising just a single monolayer or a few monolayers of atoms. For example, the conductive pattern layer may comprise a few monolayers of graphene formed on a strained $SiN_x$ bilayer, or a single monolayer of graphene may be formed on hexagonal boron nitride, which may replace the strained $SiN_x$ bilayer. It is also contemplated that the conductive pattern layer may comprise carbon nanotubes (in the form of bundles or an array) that may be grown on, for example, a quartz substrate and then transferred to a strained SiNx bilayer for roll-up.

Typically, the conductive pattern layer 120 may have a thickness of at least about 5 nm, at least about 10 nm, at least about 20 nm, at least about 50 nm, at least about 70 nm, or at least about 90 nm. The thickness may also be about 200 nm or less, about 150 nm or less, or about 100 nm or less. For example, the thickness may range from about 10 nm to about 100 nm, or from about 20 nm to about 80 nm. However, in some embodiments, such as those in which the conductive pattern layer comprises a two-dimensional material as discussed above, the thickness may be about 1 nm or less, down to a few monolayers or to one monolayer.

Each of the first conductive film 120a and the second conductive film 120b may comprise a different thickness. The conductive feed lines 165 may also comprise a thickness different from that of the first and/or second conductive films 120a, 120b. To facilitate rolling up of the planar structure into a coaxial transmission line, the first conductive film 120a may have a smaller thickness than the conductive feed lines 165. The conductive feed lines may each have the same thickness, but the thickness may be smaller than that of the second conductive film 120b. In other words, the first conductive film 120a may comprise a first thickness t1, the two conductive feed lines 165 may comprise a second thickness t2, and the second conductive film 120b may comprise a third thickness t3, where t1<t2<t3. For example, the first thickness t1 may be in the range of about 20 nm to about 100 nm, the second thickness t2 may be in the range of about 30 nm to 150 nm, and the third thickness t3 may be in the range of about 50 nm to about 300 nm. Consequently, the rolled-up transmission line structure 100 may comprise an air gap between the signal line (or center core) and the conductive shield in a radial direction.

Transverse electromagnetic (TEM) mode may be built in the air gap between the center core and the conductive shield. Besides functioning to transfer the signal to the center core (formed by the first conductive film upon roll-up), the conductive feed lines may be designed to lift the center core up to be coaxial with the conductive shield (formed by the second conductive film upon roll-up). The characteristic impedance of a coaxial transmission line may be determined by the ratio of the conductive shield radius and the center core radius, where the conductive shield radius ($r_s$) and the center core radius ($r_c$) are defined as shown in FIG. 5C. The ratio can be tuned at will by adjusting the thicknesses t1, t2, and/or t3. Advantageously, the ratio may be from about 1.2 to 5, or from 2 to 3, such as 2.3. In some examples, the center core radius $r_c$ may lie in the range of from about 0.5 micron to about 25 microns, and the conductive shield radius $r_s$ may lie in the range of from about 1 micron to about 100 microns.

The rolled configuration of the multilayer sheet may have a length along the longitudinal axis that depends on the length $L_1$ of the first conductive film that functions as the signal line of the transmission line structure. Typically, the length is at least about at least about 50 microns, at least about 100 microns, at least about 300 microns, at least about 500 microns, at least about 800 microns, or at least about 1000 microns, and the length may also be about 3000 microns or less, about 2000 microns or less, or about 1000 microns or less. For example, the length may range from about 300 microns to about 3000 microns, or from about 500 microns to about 2000 microns, or from about 500 microns to about 1000 microns.

The inner diameter of the rolled configuration depends on the thickness of the multilayer sheet as well as the amount of strain in the unrolled strained layer prior to release of the sacrificial layer. A thicker multilayer sheet may tend to roll to a larger inner diameter; however, a higher level of strain in the strained layer can offset this effect, since the inner diameter (D) of the rolled configuration is proportional to the thickness (t) of the multilayer sheet and is inversely proportional to the amount of strain ($\epsilon$) therein (D$\propto$t/$\epsilon$). The rolled configuration of the multilayer sheet typically has a diameter (inner diameter) of from about 1 micron to about 50 microns, from about 1 micron to about 10 microns, or from about 3 microns to about 8 microns. This inner diameter may correspond to about twice the value of the center core radius $r_c$ (where the thickness of the strain-relieved layer is assumed to be negligible). The inner diameter of the rolled configuration may be no more than about 30 microns, no more than about 20 microns, or no more than about 10 microns. The inner diameter may also be at least about 1 micron, at least about 4 microns, or at least about 8 microns. However, in some cases, such as when a few monolayers or just a single monolayer of a two-dimensional material is employed as the conductive film, and/or when the strained layer comprises single crystal films, the inner diameter of the rolled configuration may be significantly smaller due to the reduced sheet thickness. For example, the inner diameter may be no more than 100 nm, no more than 40 nm, no more than 10 nm, or no more than 5 nm, and typically the inner diameter is at least about 1 nm.

Depending on (a) the length of the multilayer sheet in the rolling or circumferential direction, (b) the thickness t of the multilayer sheet, and (c) the amount of strain $\epsilon$ in the multilayer sheet prior to rolling, the rolled configuration may include a large number of turns (e.g., up to 100 turns, or more). However, for this particular rolled-up device, a large number of turns may not be necessary. Typically, the center core includes from less than 1 to 5 turns, or from 1 to 3 turns. Similarly, the conductive shield may include from less than 1 to 5 turns, or from 1 to 3 turns. Overall, the rolled configuration may include from 1 to 10 turns, from 2 to 6 turns, or from 1 to 4 turns. The number of turns can be influenced by the size (e.g., length and thickness) and shape of the multilayer sheet before rolling up.

Figure 5A:
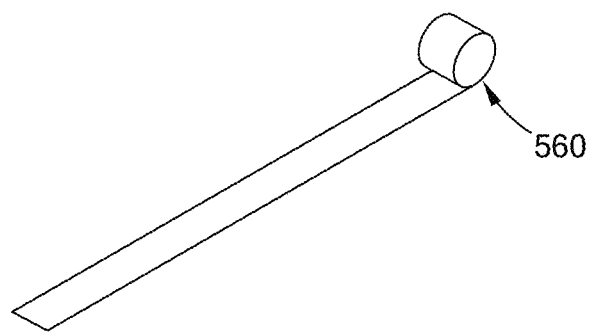
FIGS. 5A-5C show the results of a finite element method (FEM) simulation of local stress controlled nanotechnology, where
Figure 5B:
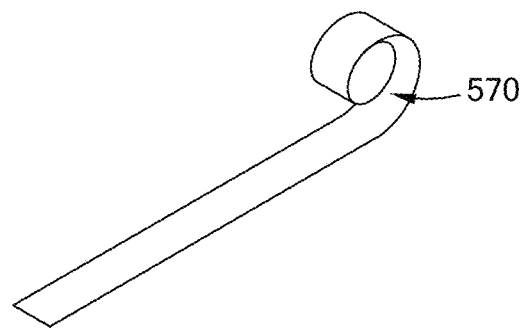
Figure 5C:
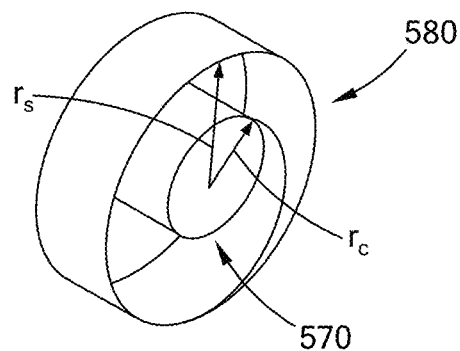

Referring to FIGS. 5A-5C, finite element method (FEM) modeling is used to perform a mechanical simulation to verify the concept of local stress control over the rolled-up transmission line structure. FIGS. 5A-5C show some frames from a dynamic rolling simulation result. The simulated planar structure prior to rolling has the same design as shown in FIG. 2 but with a shorter length in order to simplify the simulation. FIG. 5A shows the formed center core 560 after the first conductive film is rolled up to one turn. FIG. 5B shows the lifted center core 570 after the conductive feed lines are rolled up to a half turn with a larger diameter (due to the increased thickness t2 compared to t1). FIG. 5C shows the formed conductive shield 580 after the second conductive film is rolled up to one turn having the largest diameter (due to the further increased thickness t3 compared to t2).

As substantially all of the electromagnetic wave is confined and transmits in the air gap, there are almost no radiation and dielectric losses. The ohmic loss may be caused by surface current on the center core and the metallic shield. Depending on the working frequency, the thicknesses of the deposited conductive thin film(s) that form the conductive pattern layer can be fabricated to be equal to or larger than the skin depth (the electromagnetic wave penetration depth into metal surface or the thickness of surface current cross section). For example, up to a frequency of about 10 THz, where the skin depth may be tens of nanometers (e.g., the skin depth of silver at 10 THz is 20 nm) the thickness of the conductive pattern layer may be made sufficiently large such that the skin effect can be ignored. Accordingly, the ohmic loss may be independent of frequency or weakly dependent on frequency at frequencies up to about 10 THz. Moreover, the total resistance can be further reduced by depositing a thicker conductive thin film (e.g., about 100 nm or higher) with high(er) conductivity. By calculation, the cut-off frequency of the first high electromagnetic wave mode ($TE_{11}$) is larger than about 10 THz when the sum of the metallic shield radius and the center core radius is smaller than 10 µm.

Figure 6A:
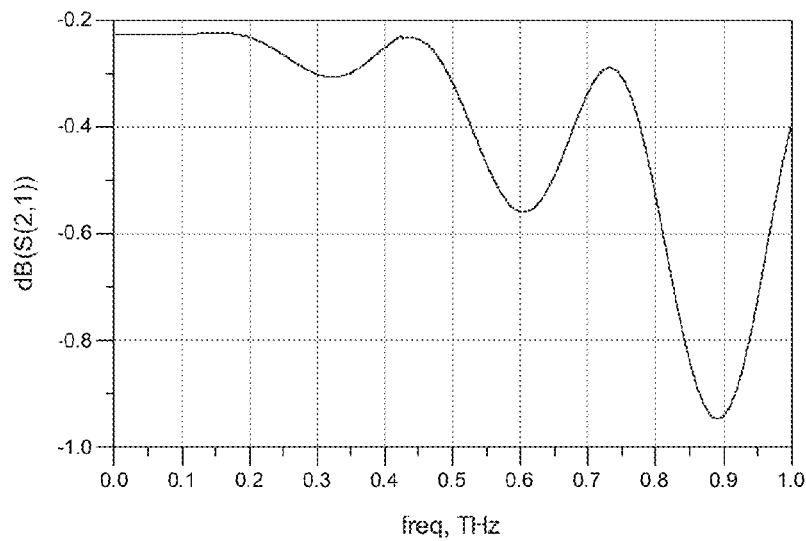
FIGS. 6A and 6B show the simulated $S_{21}$ parameter from 1 GHz to 1 THz for an on-chip coaxial transmission line with a length of 500 microns (FIG. 6A) and 1000 microns (FIG. 6B), where the widths of the feed lines are not included in the length.
Figure 6B:
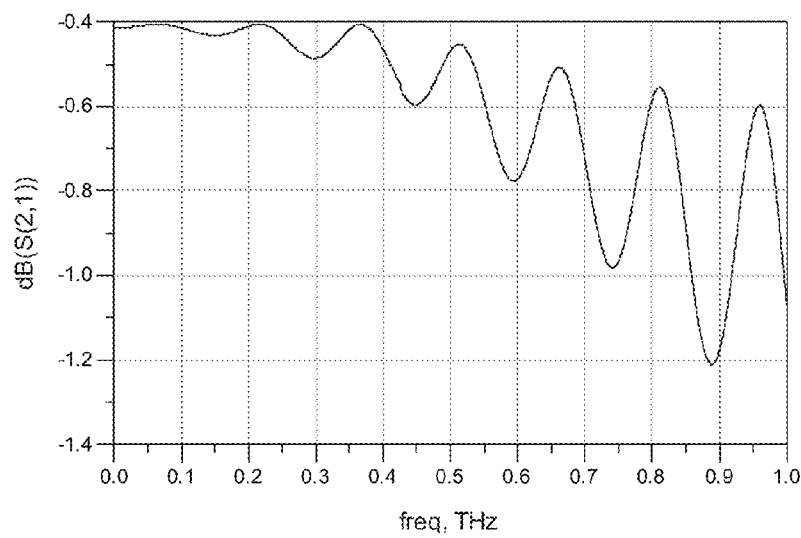

In order to maximize transmission of signal energy as much as possible even in the THz band, it is advantageous to minimize electromagnetic wave reflection at the ports and the ohmic loss along the center core and metallic shield. To match the commonly used 50Ω characteristic impedance in integrated circuit design, the ratio of the metallic shield radius and the center core radius is chosen to be 2.3. To reduce the skin effect, the total ohmic loss and to be compatible with current IC processing, the high conductivity material of the conductive pattern layer is chosen to be copper with a thickness of 100 nm. A standard coaxial transmission line model that takes into account the skin effect and parasitic parameters is used for the simulations. FIGS. 6A and 6B show the simulated $S_{21}$ parameter of the coaxial transmission line illustrated in FIGS. 2 and 3 from 1 GHz to 1 THz with different lengths. In this example, the simulated on-chip coaxial transmission line has two 400 µm wide feed lines which offer standard 50Ω characteristic impedance when be used as microstrip lines and deposited on a 700~750 µm thick silicon wafer.

Figure 7A:
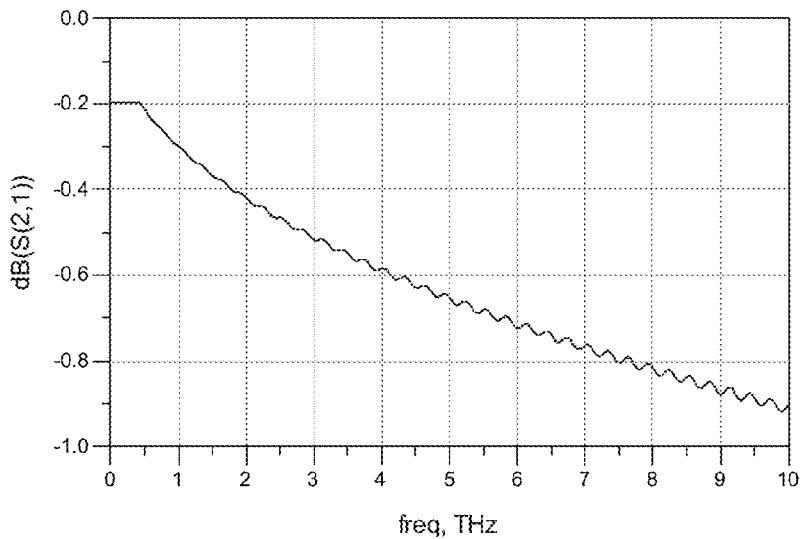
FIGS. 7A and 7B show the simulated $S_{21}$ parameter from 1 GHz to 1 THz for an on-chip coaxial transmission line with a length of 500 microns (FIG. 6A) and 1000 microns (FIG. 6B), where the feedlines have been removed.
Figure 7B:
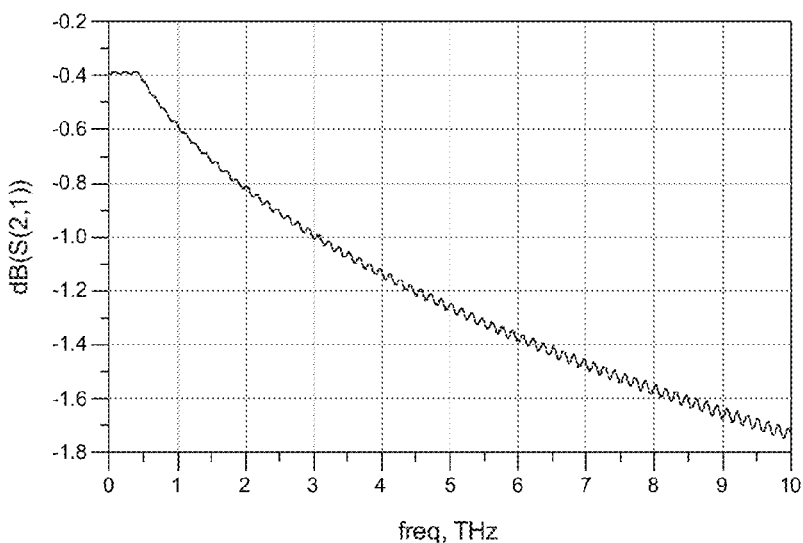

The results in FIGS. 6A-6B show increasing oscillating curves of $S_{21}$ which may be caused by the conductive feed lines, as they may act as two small inductors connected in series with the coaxial line. Specifically, FIG. 6A shows data for a length of 500 µm and FIG. 6B shows data for a length of 1000 µm, where the widths of the conductive feed lines are not included. The inner diameter of the center core is assumed to be 16.5 microns and the inner diameter of the conductive shield is assumed to be 38.9 microns. Although these parasitic inductances are small (about 7.2 pH in total), they may increase dramatically when the frequency steps into the THz band. However, it is possible to remove the conductive feed lines in some cases, such as when integrated with other tube passive components in one tube. FIGS. 7A and 7B show the simulated $S_{21}$ parameter from 1 GHz to 10 THz with different lengths when the conductive feed lines are removed. Specifically, FIG. 7A shows data for a length of 500 µm and FIG. 7B shows data for a length of 1000 µm. The slight dropping of $S_{21}$ is caused by the skin effect when the frequency is higher than 0.4 THz. The increasing oscillating $S_{21}$ disappears and the total loss is then smaller than 0.006 dB/mm. By calculation, the on-chip coaxial transmission line with the sum of the metallic shield radius and the centre core radius smaller than 30 µm can handle a maximum transmission power of about 4.5 W at 10 THz.

Fabrication Method

A method of making a rolled-up transmission line structure for a radiofrequency integrated circuit includes forming a sacrificial layer on a substrate and forming a strained layer on the sacrificial layer, where the strained layer comprises an upper portion under tensile stress and a lower portion under compressive stress. The strained layer is held on the substrate by the sacrificial layer. A conductive pattern layer comprising a first conductive film separated from a second conductive film is formed on the strained layer, and removal of the sacrificial layer from the substrate is initiated, thereby releasing an end of the strained layer. The removal of the sacrificial layer is continued, thereby allowing the strained layer to move away from the substrate and roll up to relieve strain in the strained layer. The conductive pattern layer adheres to the strained layer during the roll-up, and a rolled-up transmission line structure is formed. After the roll-up, the first conductive film surrounds the longitudinal axis and forms a center core of the rolled-up structure, and the second conductive film surrounds the first conductive film. The first conductive film serves as a signal line for carrying a time varying current, and the second conductive film serves as a conductive shield.

Forming the strained layer may entail depositing two sublayers that have different lattice parameters. Forming the strained layer may also or alternatively entail depositing two sublayers having different stoichiometries. A deposition method known in the art, such as physical vapor deposition or chemical vapor deposition, may be employed to form the strained layer and/or the sacrificial layer. The sacrificial layer may be removed by wet or dry etching with an appropriate etchant. The sacrificial layer may comprise a metal such as Ge that may be preferentially etched without etching the overlying strained layer or the underlying substrate material.

The conductive pattern layer may be formed by depositing a metal thin film on the strained layer by a vapor deposition method such as sputtering or evaporation, and then patterning the metal thin film using lithography and etching steps known in the art to create a metal pattern, thereby forming the conductive pattern layer. The conductive pattern layer may include at least one conductive line connected to the sacrificial layer and/or at least one conductive line connected to the substrate.

An exemplary fabrication method is described below in reference to FIGS. 8A-8G for an arbitrary conductive pattern layer geometry. Deposition of an isolation layer 850 on a silicon wafer 855 is shown schematically in FIG. 8A. The isolation layer 850 may be a thick film having a thickness of from about 0.5-2 microns and may comprise an oxide (e.g., $SiO_2$). Prior to deposition of the isolation layer 850, the surface of the silicon wafer 855 may be cleaned to remove oils, organic residues and/or oxides. The isolation layer 850 is typically formed on the silicon wafer 855 using plasma enhanced chemical vapor deposition (PECVD).

Figure 8A:
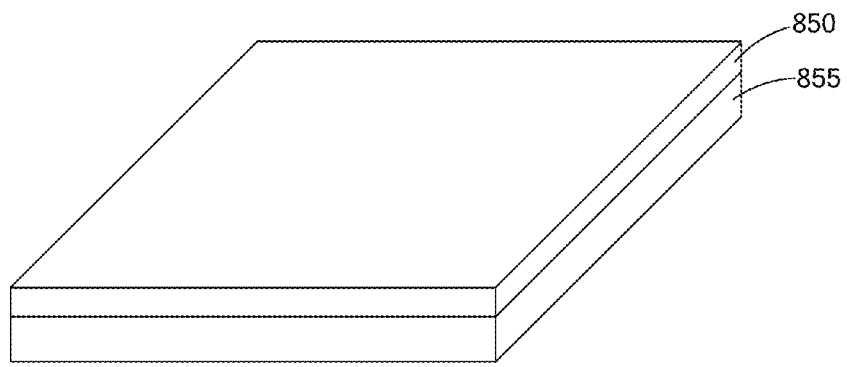
FIGS. 8A-8F show exemplary processing steps to form a rolled-up device structure.
Figure 8B:
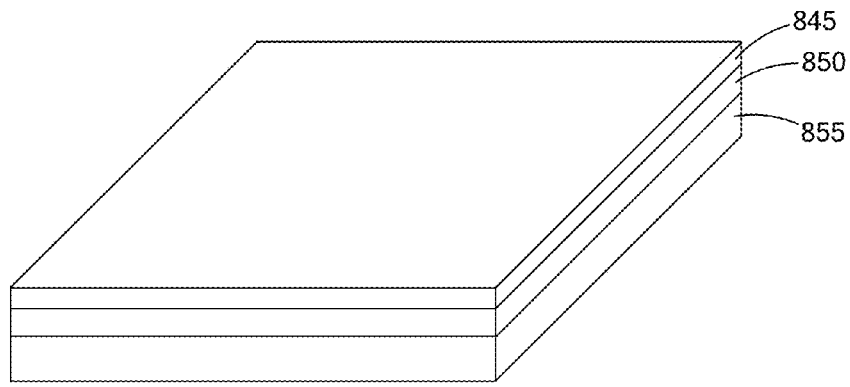

Next, the sacrificial layer 845 may be formed on the isolation layer 850, as shown schematically in FIG. 8B. A vapor deposition method such as electron beam evaporation or sputtering may be used. In this example, the sacrificial layer 845 comprises germanium deposited to a thickness of about 20 nm in thickness, although the thickness of the sacrificial layer 845 may more generally range from about 5 nm to about 50 nm, and other selectively etchable materials may be used.

Figure 8C:
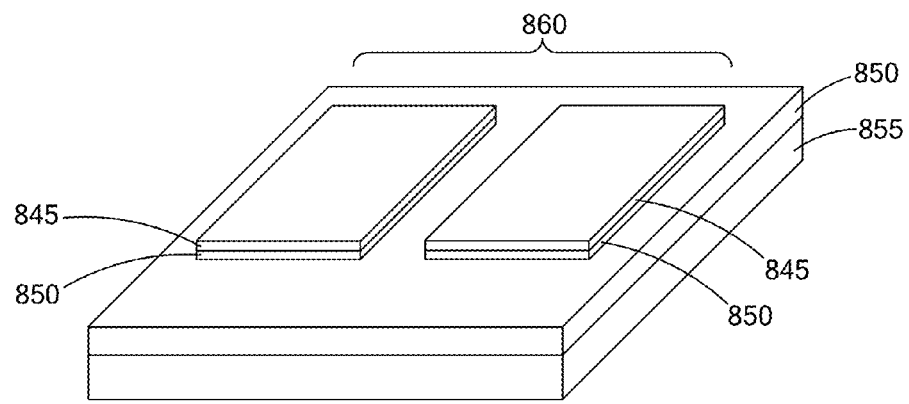

Optical lithography is used to define the desired substrate or stage pattern 860 followed by Freon reactive ion etching (RIE), or another suitable etching method, to remove unwanted portions of the sacrificial layer 845 and etch a considerable depth into the isolation layer 850, as illustrated in FIG. 8C.

Figure 8D:
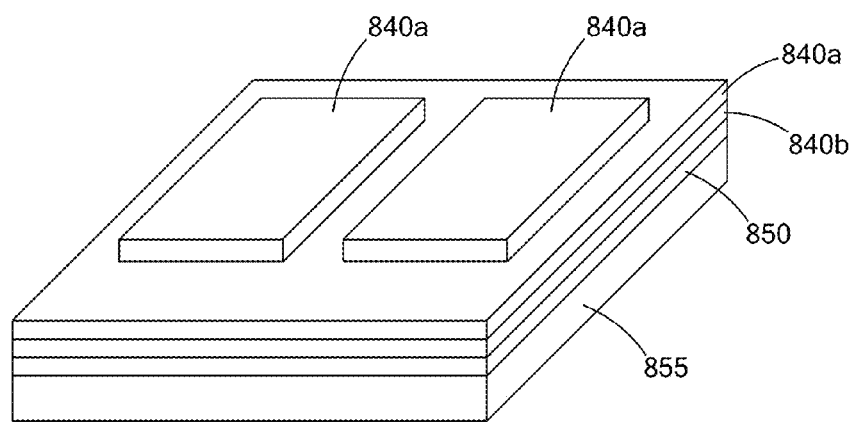
Figure 8E:
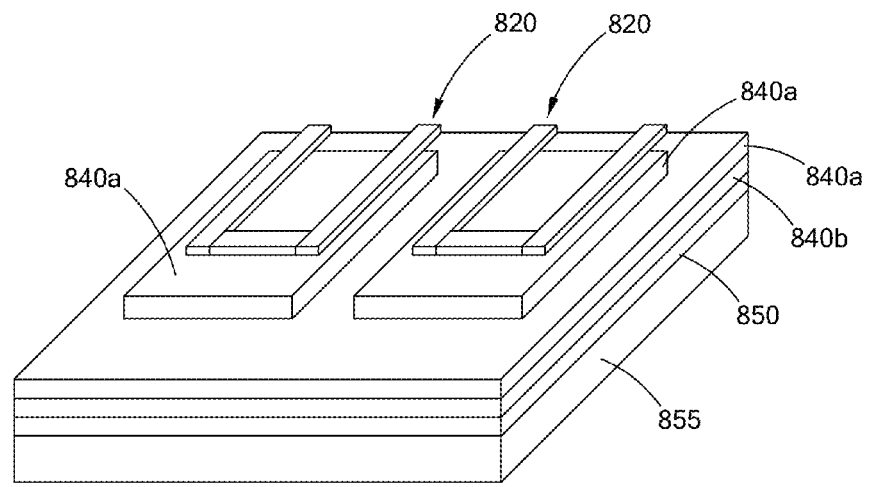

Referring to FIG. 8D, the next step is strained layer deposition, where, in this exemplary process, low and high frequency PECVD processes are employed in sequence to deposit oppositely strained SiN$_x$ layers 840b, 840a. As shown in FIG. 8E, conductive strips (or generally speaking, the conductive pattern layer 820) may be formed by optical lithography followed by electron beam evaporation to deposit a nickel thin film of about 5 nm in thickness and a gold film of about 60 nm or more in thickness, followed by lift-off technology to remove unwanted portions of the metal layer. If the rolled-up device includes conductive strips of different thicknesses (as is the case with the rolled-up transmission line structure), multiple lithography steps (e.g., three) instead of just a single lithography step, may be used. In addition, to achieve higher resolution pattern features, advanced lithography methods, such as deep ultraviolet (DUV) or extreme ultraviolet (EUV) lithography or e-beam lithography may be used.

Figure 8F:
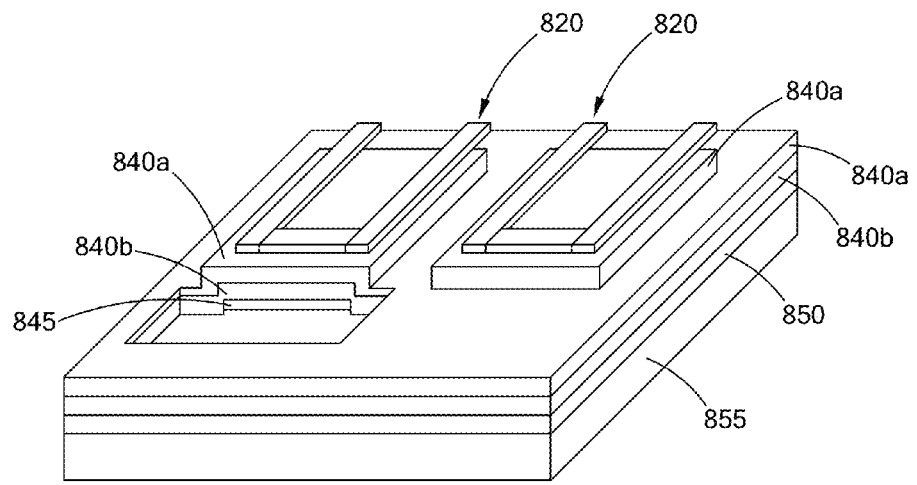

Optical lithography is employed for an additional time to define window patterns, followed by Freon RIE to etch away the unwanted portions of the layers defined by the window patterns, thereby forming openings in the layers that allow access to the underlying sacrificial layer 845, as shown schematically in FIG. 8F. Finally, an appropriate etchant may be used to etch the sacrificial layer 845 and enable the strained layers 840a, 840b to be released and to roll up, as shown schematically in FIGS. 1C and 1D. For example, in the case of a Ge sacrificial layer 845, the wet etching may be carried out using 50 ml 30% hydrogen peroxide with 2 ml citric acid as the etchant at 90° C.

Figure 8G:
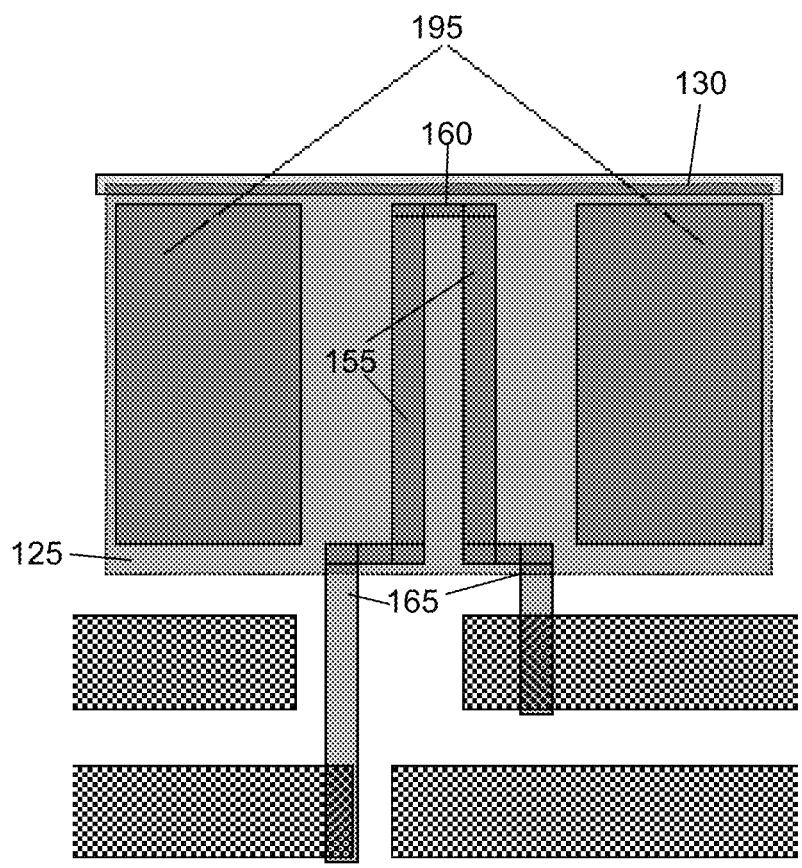
FIG. 8G illustrates the use of side support strips in fabrication.

FIG. 8G shows a top view of an exemplary conductive pattern layer comprising conductive strips 155 on a strained layer 125 prior to rolling, in which support film strips 195 are positioned outside the conductive strips 155 on the strained layer 125 to facilitate an even rolling process. This may be particularly advantageous when the length of the conductive strips 155 is long and the rolled configuration 110 includes a large number of turns. The support film strips 195 are typically located at least 50 microns away from the nearest conductive strips 155 and have no connection to the conductive strips 155. The support film strips 195 may be formed as part of the metal pattern layer and may have the same thickness as the conductive strips 155.

An exemplary transfer printing process uses a patterned polymeric (typically PDMS) stamp to selectively pick up nanostructures (in this case, rolled-up transmission line structures) from their native substrates and deposit them in a desired layout onto functional substrates, without the use of adhesives. Such a process is described in U.S. Patent Application Publication 2013/0036928 (J. A. Rogers, P. Ferreira, and R. Saeidpourazar), entitled "Non-Contact Transfer Printing," which is hereby incorporated by reference. High density packing of rolled-up transmission lines and/or other rolled-up devices for a RFIC can be achieved using transfer printing. The technology has already been demonstrated at a commercial scale for solar cells (Semprius, Inc., Durham, N.C.).

Diverse applications for rolled-up device structures have been proposed theoretically and some have been demonstrated experimentally, including III-V quantum dot microtube lasers, metamaterials based on arrays of gold/GaAs tubes, optical tube resonators integrated with silicon on insulator (SoI) waveguides, and biological sensors using microtube resonators. Recently, a metal (Ti/Cr)/insulator (Al$_2$O$_3$)/metal (Ti/Cr) tube capacitor structure has been demonstrated experimentally for ultracompact energy storage. These tube capacitors are almost two orders of magnitude smaller than their planar counterparts. In the present disclosure, a novel design platform has been described for on-chip transmission lines based on strain-induced self-rolled-up nanotechnology, which produces 3D architectures through simple planar processing.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. A rolled-up transmission line structure for a radiofrequency integrated circuit (RFIC), the rolled-up transmission line structure comprising:
   a multilayer sheet in a rolled configuration comprising multiple turns about a longitudinal axis, the multilayer sheet comprising a conductive pattern layer on a strain-relieved layer, the conductive pattern layer comprising a first conductive film separated from a second conductive film in a rolling direction,
   wherein the strain-relieved layer comprises two layers, and wherein, in an unrolled configuration of the multilayer sheet, a top layer of the two layers is in tension and a bottom layer of the two layers is in compression, and
   wherein, in the rolled configuration, the first conductive film surrounds the longitudinal axis and forms a center core of the rolled-up transmission line structure, the first conductive film being a signal line, and the second conductive film surrounds the first conductive film, the second conductive film being a conductive shield.

2. The rolled-up transmission line structure of claim 1, wherein each of the first conductive film and the second conductive film comprises a different thickness.

3. The rolled-up transmission line structure of claim 1, wherein the second conductive film surrounds only a central longitudinal portion of the first conductive film.

4. The rolled up transmission line structure of claim 1, wherein the conductive pattern layer further comprises two conductive feed lines connected to the first conductive film at respective ends thereof, the two conductive feed lines extending away from the first conductive film in a rolling direction.

5. The rolled-up transmission line structure of claim 4, wherein the first conductive film comprises a first thickness t1, the two conductive feed lines comprise a second thickness t2, and the second conductive film comprises a third thickness t3, wherein t1<t2<t3, the transmission line thereby comprising an air gap between the center core and the conductive shield in a radial direction.

6. The rolled-up transmission line structure of claim 5, wherein the first thickness t1 is from about 20 nm to about 100 nm, the second thickness t2 is from about 30 nm to about 150 nm, and the third thickness t3 is from about 50 nm to about 300 nm.

7. The rolled-up transmission line structure of claim 1, wherein the first conductive film comprises a rolled-up rectangular shape in the rolled configuration, the rolled-up rectangular shape having a length extending along the longitudinal axis and a width extending in the rolling direction.

8. The rolled-up transmission line structure of claim 1, wherein the second conductive film comprises a rolled-up rectangular shape in the rolled configuration, the rolled-up rectangular shape having a length extending along the longitudinal axis and a width extending in the rolling direction.

9. The rolled-up transmission line structure of claim 1, wherein each of the two layers comprises non-stoichiometric silicon nitride.

10. The rolled-up transmission line structure of claim 1, wherein the conductive pattern layer comprises one or more materials selected from the group consisting of carbon, silver, gold, aluminum, copper, molybdenum, tungsten, zinc, platinum, palladium, and nickel.

11. The rolled-up transmission line structure of claim 1, wherein the rolled configuration of the multilayer sheet has a length along the longitudinal axis of from about 300 microns to about 3000 microns.

12. The rolled-up transmission line structure of claim 1, wherein the rolled configuration of the multilayer sheet comprises from about 1 turn to about 4 turns.

13. The rolled-up transmission line structure of claim 1, wherein the rolled configuration of the multilayer sheet has an inner diameter of from about 1 micron to about 30 microns.

14. The rolled-up transmission line structure of claim 1, wherein a ratio of a center core radius to a conductive shield radius is from about 1.2 to about 5.

15. The rolled-up transmission line structure of claim 1, wherein the first conductive film and the second conductive film are coaxial.

16. A device comprising:
   a plurality of the rolled-up transmission line structures of claim 1 on a substrate.

17. The device of claim 16, wherein the rolled-up transmission line structures are components of a radiofrequency integrated circuit (RFIC), the substrate comprising a semiconductor.

18. A method of making a rolled-up transmission line structure for a radiofrequency integrated circuit (RFIC), the method comprising:
   forming a sacrificial layer on a substrate;
   forming a strained layer on the sacrificial layer, the strained layer comprising an upper portion under tensile stress and a lower portion under compressive stress, the strained layer being held on the substrate by the sacrificial layer;
   forming a conductive pattern layer comprising a first conductive film separated from a second conductive film on the strained layer;
   initiating removal of the sacrificial layer from the substrate, thereby releasing an end of the strained layer, and
   continuing the removal of the sacrificial layer, thereby allowing the strained layer to move away from the substrate and roll up to relieve strain in the strained layer, the conductive pattern layer adhering to the strained layer during the roll-up, thereby forming a rolled-up transmission line structure,
   wherein, after the roll-up, the first conductive film surrounds the longitudinal axis and forms a center core of the rolled-up transmission line structure, the first conductive film being a signal line, and the second conductive film surrounds the first conductive film, the second conductive film being a conductive shield.

19. The method of claim 18, further comprising transferring the rolled-up transmission line structure to a different substrate.

20. A rolled-up transmission line structure for a radiofrequency integrated circuit (RFIC), the rolled-up transmission line structure comprising:
   a multilayer sheet in a rolled configuration comprising multiple turns about a longitudinal axis, the multilayer sheet comprising a conductive pattern layer on a strain-relieved layer, the conductive pattern layer comprising a first conductive film separated from a second conductive film in a rolling direction,
   wherein the conductive pattern layer further comprises two conductive feed lines connected to the first conductive film at respective ends thereof, the two conductive feed lines extending away from the first conductive film in a rolling direction, and
   wherein, in the rolled configuration, the first conductive film surrounds the longitudinal axis and forms a center core of the rolled-up transmission line structure, the first conductive film being a signal line, and the second conductive film surrounds the first conductive film, the second conductive film being a conductive shield.

* * * * *